United States Patent
Munakata et al.

(10) Patent No.: US 9,560,770 B2
(45) Date of Patent: Jan. 31, 2017

(54) COMPONENT BUILT-IN BOARD AND METHOD OF MANUFACTURING THE SAME, AND MOUNTING BODY

(71) Applicant: FUJIKURA LTD., Tokyo (JP)

(72) Inventors: Koji Munakata, Sakura (JP); Shin Hitaka, Sakura (JP)

(73) Assignee: FUJIKURA LTD., Tokyo (JP)

(*) Notice: Subject to any disclaimer, the term of this patent is extended or adjusted under 35 U.S.C. 154(b) by 248 days.

(21) Appl. No.: 14/182,758

(22) Filed: Feb. 18, 2014

(65) Prior Publication Data

US 2014/0233199 A1    Aug. 21, 2014

(30) Foreign Application Priority Data

Feb. 19, 2013  (JP) ................................ 2013-030258
Nov. 1, 2013   (JP) ................................ 2013-227865

(51) Int. Cl.
| | |
|---|---|
| H05K 1/18 | (2006.01) |
| H05K 3/46 | (2006.01) |
| H05K 3/32 | (2006.01) |
| H01L 23/00 | (2006.01) |

(52) U.S. Cl.
CPC ............. *H05K 1/186* (2013.01); *H01L 24/19* (2013.01); *H05K 1/185* (2013.01); *H05K 3/32* (2013.01);
(Continued)

(58) Field of Classification Search
CPC ...... H05K 1/0306; H05K 1/162; H05K 1/167; H05K 1/144; H01L 25/105
(Continued)

(56) References Cited

U.S. PATENT DOCUMENTS 7,321,164 B2 *  1/2008  Hsu .................... H01L 23/5389
                                                       257/685
7,706,148 B2 *  4/2010  Hsu .................... H01L 23/5385
                                                       361/770
(Continued)

FOREIGN PATENT DOCUMENTS

EP    1 365 451 A1    11/2003
EP    1 724 832 A2    11/2006
(Continued)

OTHER PUBLICATIONS

Extended European Search Report dated May 8, 2014, issued in corresponding European Patent Application No. 14155680.3 (6 pages).

*Primary Examiner* — Tuan T Dinh
(74) *Attorney, Agent, or Firm* — Westerman, Hattori, Daniels & Adrian, LLP

(57) ABSTRACT

A component built-in board of multi-layer structure that has a plurality of unit boards stacked therein and is configured having a plurality of electronic components built in thereto in a stacking direction, wherein the plurality of unit boards include: a double-sided board that includes a first insulating layer, a first wiring layer formed on both surfaces of the first insulating layer, and a first interlayer conductive layer that penetrates the first insulating layer and is connected to the first wiring layer, and that comprises an opening in which the electronic component is housed; and an intermediate board that includes a second insulating layer, a first adhesive layer provided on both surfaces of the second insulating layer, and a second interlayer conductive layer that penetrates the second insulating layer along with the first adhesive layer, and the double-sided board is disposed above and below the intermediate board.

19 Claims, 7 Drawing Sheets

(52) U.S. Cl.
CPC .............. *H05K 3/46* (2013.01); *H05K 3/4673* (2013.01); *H01L 2224/0401* (2013.01); *H01L 2224/04105* (2013.01); *H01L 2224/16225* (2013.01); *H01L 2924/12042* (2013.01); *H01L 2924/1531* (2013.01); *H01L 2924/181* (2013.01); *H01L 2924/19105* (2013.01); *H01L 2924/19106* (2013.01); *Y10T 29/49139* (2015.01)

(58) Field of Classification Search
USPC .......... 361/763–790, 792–795; 257/685–730
See application file for complete search history.

(56) References Cited

U.S. PATENT DOCUMENTS

| | | | |
|---|---|---|---|
| 7,807,512 B2* | 10/2010 | Lee | ..................... H01L 21/6835 438/107 |
| 8,168,893 B2* | 5/2012 | Ito | ..................... H01L 23/49838 174/260 |
| 2008/0117608 A1* | 5/2008 | Seo | ......................... H01L 24/18 361/761 |
| 2009/0290317 A1* | 11/2009 | Mashino | ............. H01L 21/6835 361/782 |
| 2011/0240356 A1 | 10/2011 | Wakita et al. | |

FOREIGN PATENT DOCUMENTS

| | | |
|---|---|---|
| EP | 2 228 824 A1 | 9/2010 |
| JP | 2001-332866 A | 11/2001 |
| JP | 2004-343021 A | 12/2004 |
| JP | 2005-268378 A | 9/2005 |
| JP | 2005-317903 A | 11/2005 |
| JP | 2007-80857 A | 3/2007 |
| JP | 2009-164287 A | 7/2009 |
| JP | 2012-69863 A | 4/2012 |

* cited by examiner

COMPONENT BUILT-IN BOARD AND METHOD OF MANUFACTURING THE SAME, AND MOUNTING BODY

CROSS-REFERENCE TO RELATED APPLICATIONS

This application is based upon and claims the benefit of priority from the prior Japanese Patent Application No. 2013-030258, filed on Feb. 19, 2013, and the prior Japanese Patent Application No. 2013-227865, filed on Nov. 1, 2013, the entire contents of which are incorporated herein by reference.

BACKGROUND OF THE INVENTION

Field of the Invention

This invention relates to a component built-in board having an electronic component built in thereto, and a method of manufacturing the same, and to a mounting body.

Description of the Prior Art

In order to meet the demand in recent years for further miniaturization or higher performance levels mainly in compact precision electronic instruments, miniaturization or higher levels of integration are being required also of substrate-mounted semiconductor devices. In response to such a demand, it is becoming increasingly necessary to handle higher levels of integration while advancing miniaturization of semiconductor devices, by three-dimensional packaging technology such as CoC (Chip on Chip) and PoP (Package on Package), or by component built-in board technology.

A known semiconductor device employing component built-in board technology is the multi-layer printed wiring board disclosed in Unexamined Japanese Patent Application Publication No. 2007-80857 A. This multi-layer printed wiring board has a plurality of printed wiring boards that each have a wiring layer formed on an insulating board thereof stacked via an insulator spacer having an adhesive layer formed on both surfaces thereof, and has an electronic component built in to a space between the printed wiring boards formed by the insulator spacer.

SUMMARY OF THE INVENTION

However, in the multi-layer printed wiring board of conventional technology disclosed in above-mentioned Unexamined Japanese Patent Application Publication No. 2007-80857 A, an insulator spacer which is thicker than a thickness of the built-in electronic component is disposed between each of the printed wiring boards, and stacking is performed in multi-layers in a state where an air gap for building in the electronic component is formed between each of the printed wiring boards. Therefore, there are problems that a manufacturing process becomes complicated and that it becomes difficult to achieve thinning of the multi-layer printed wiring board overall.

This invention has an object of overcoming the above-mentioned problems due to the conventional technology to provide a component built-in board that allows overall thinning thereof to be achieved while a manufacturing process thereof is simplified and a method of manufacturing the component built-in board, and to provide a mounting body.

A component built-in board according to an embodiment of the present invention, the component built-in board being a component built-in board of multi-layer structure that has a plurality of unit boards stacked therein and is configured having a plurality of electronic components built in thereto in a stacking direction, wherein the plurality of unit boards include: a double-sided board that includes a first insulating layer, a first wiring layer formed on both surfaces of the first insulating layer, and a first interlayer conductive layer that penetrates the first insulating layer and is connected to the first wiring layer, and that comprises an opening in which the electronic component is housed; and an intermediate board that includes a second insulating layer, a first adhesive layer provided on both surfaces of the second insulating layer, and a second interlayer conductive layer that penetrates the second insulating layer along with the first adhesive layer, and the double-sided board is disposed in each of a layer above and a layer below the intermediate board.

As a result of the component built-in board according to the embodiment of the present invention, in a component built-in board that has a plurality of unit boards stacked therein and is configured having a plurality of electronic components built in thereto, a double-sided board having an electronic component housed in an opening thereof is disposed in a layer above and a layer below an intermediate board, hence compared to a conventional component built-in board, the number of insulator spacers can be reduced whereby a thickness of a place where the electronic component is stored can be reduced, and it becomes possible to achieve thinning of the component built-in board overall by a simple manufacturing process.

In another embodiment of the present invention, the plurality of unit boards include: a single-sided board that comprises a third insulating layer, a second wiring layer formed on one of surfaces of the third insulating layer, a third interlayer conductive layer that penetrates the third insulating layer and is connected to the second wiring layer, and a second adhesive layer provided on the other of the surfaces of the third insulating layer, and a portion of the third interlayer conductive layer of the single-sided board is connected to the electronic component, and the single-sided board and the intermediate board are stacked sandwiching the double-sided board that has the electronic component housed therein in the opening.

In yet another embodiment of the present invention, the plurality of unit boards include: a single-sided board that comprises a third insulating layer, a second wiring layer formed on one of surfaces of the third insulating layer, a third interlayer conductive layer that penetrates the third insulating layer and is connected to the second wiring layer, and a second adhesive layer provided on the other of the surfaces of the third insulating layer, and a portion of the third interlayer conductive layer of the single-sided board is connected to the electronic component, and the intermediate board and the double-sided board that has the electronic component housed therein in the opening are stacked sandwiching the single-sided board.

A method of manufacturing a component built-in board according to an embodiment of the present invention, the component built-in board being a component built-in board of multi-layer structure that has a plurality of unit boards stacked therein and is configured having a plurality of electronic components built in thereto in a stacking direction, comprises the steps of: forming a first wiring layer on both surfaces of a first insulating layer, forming a first interlayer conductive layer connected to the first wiring layer by penetrating the first insulating layer, and forming in the first insulating layer an opening in which the electronic component is to be housed, to produce a double-sided board as the unit board; providing a first adhesive layer on both surfaces of a second insulating layer and forming a second interlayer conductive layer that penetrates the second insulating layer along with the first adhesive layer, to produce an intermediate board as the unit board; and housing the electronic component in the opening of the produced double-sided board and stacking a plurality of the unit boards in the stacking direction, in the step of stacking, stacking such that the double-sided board is disposed in each of a layer above and a layer below the produced intermediate board.

As a result of the method of manufacturing a component built-in board according to the embodiment of the present invention, a component built-in board that has a plurality of unit boards stacked therein and is configured having a plurality of electronic components built in thereto is manufactured by housing the electronic component in an opening of a double-sided board produced as the unit board and stacking a plurality of the unit boards in the stacking direction such that the double-sided board is disposed in each of a layer above and a layer below a produced intermediate board, hence the same working effects as those of the above-described component built-in board can be displayed.

In another embodiment of the present invention, the method of manufacturing a component built-in board further comprises the step of: forming a second wiring layer on one of surfaces of a third insulating layer, forming a third interlayer conductive layer connected to the second wiring layer by penetrating the third insulating layer, and providing a second adhesive layer on the other of the surfaces of the third insulating layer, to produce a single-sided board as the unit board, and in the step of stacking, the single-sided board and the intermediate board are stacked so as to be in a state of sandwiching the double-sided board that has the electronic component housed therein in the opening, such that a portion of the third interlayer conductive layer of the single-sided board is connected to the electronic component.

In yet another embodiment of the present invention, the method of manufacturing a component built-in board further comprises the step of: forming a second wiring layer on one of surfaces of a third insulating layer, forming a third interlayer conductive layer connected to the second wiring layer by penetrating the third insulating layer, and providing a second adhesive layer on the other of the surfaces of the third insulating layer, to produce a single-sided board as the unit board, and in the step of stacking, the intermediate board and the double-sided board that has the electronic component housed therein in the opening are stacked so as to be in a state of sandwiching the single-sided board, such that a portion of the third interlayer conductive layer of the single-sided board is connected to the electronic component.

A mounting body according to an embodiment of the present invention has another electronic component surface-mounted on at least one mounting surface of a front surface and a back surface of the above-described component built-in board.

DESCRIPTION OF THE PREFERRED EMBODIMENTS

A component built-in board and method of manufacturing the same and a mounting body according to embodiments of this invention will be described in detail below with reference to the accompanying drawings.

Figure 1:
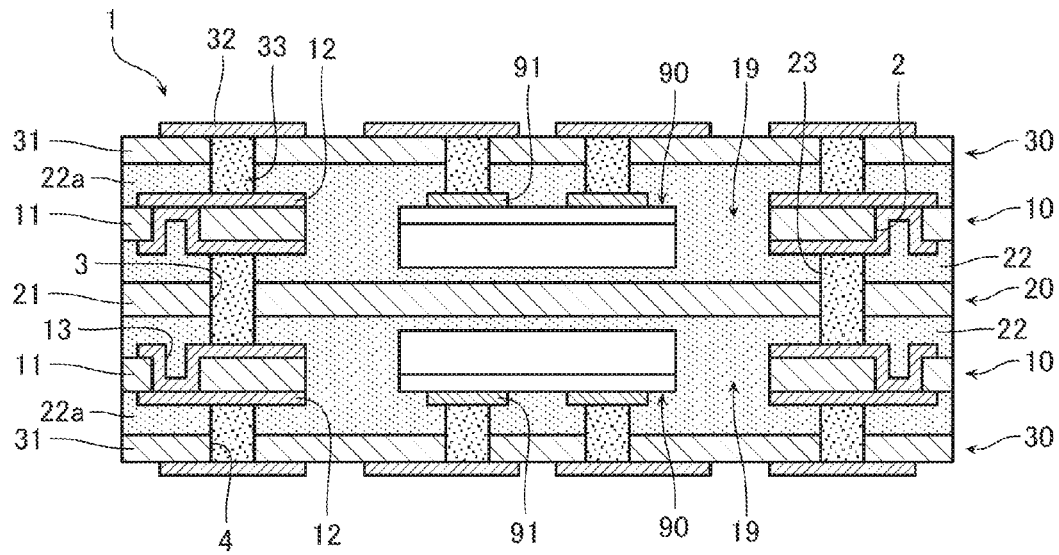
FIG. 1 is a cross-sectional view showing a component built-in board according to a first embodiment of the present invention.
Figure 2:
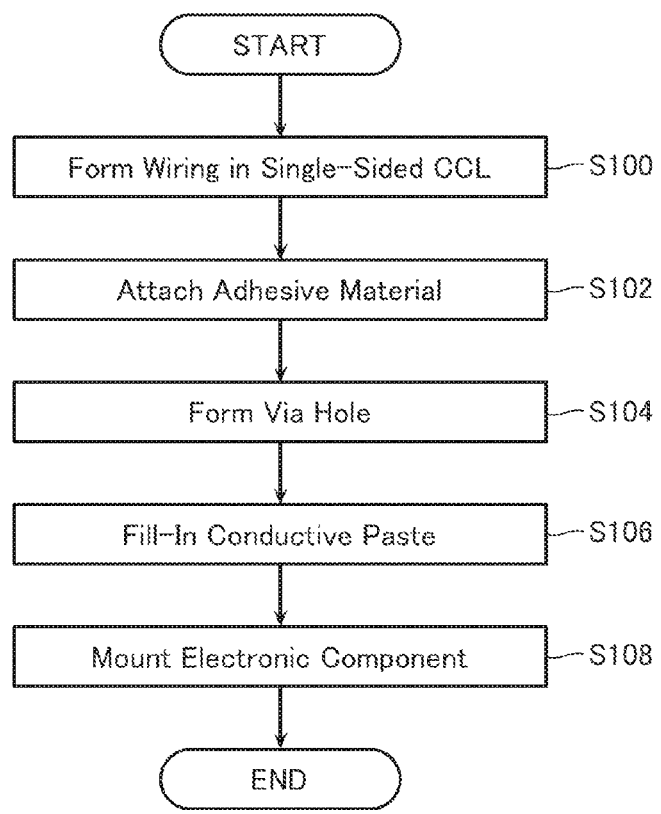
FIG. 2 is a flowchart showing a manufacturing process due to a method of manufacturing same component built-in board.

FIG. 1 is a cross-sectional view showing a component built-in board according to a first embodiment of the present invention. As shown in FIG. 1, a component built-in board 1 is configured having a plurality of unit boards stacked therein and having a plurality of electronic components 90 built in thereto in a stacking direction, and comprises a structure in which a plurality of double-sided boards 10, an intermediate board 20, and a plurality of single-sided boards 30 acting as the unit boards are stacked collectively by, for example, thermal compression bonding. Moreover, in the component built-in board 1, each of the electronic components 90 is respectively built in to an opening 19 formed in each of the double-sided boards 10, in a state of being sandwiched by the intermediate board 20 and the single-sided board 30.

Each of the double-sided boards 10 respectively comprises: a film-shaped resin base 11 acting as a first insulating layer; a wiring 12 acting as a first wiring layer, the wiring 12 being formed on both surfaces of this resin base 11; and a via 13 acting as a first interlayer conductive layer, the via 13 being formed by plating inside a via hole 2 that penetrates one of the wiring 12 and the resin base 11, the via 13 thereby connecting each of the wiring 12. Moreover, each of the double-sided boards 10 respectively comprises the opening 19 that has the resin base 11 and the wiring 12 removed at a certain place.

The intermediate board 20 comprises: a film-shaped resin base 21 acting as a second insulating layer; a first adhesive layer 22 provided on both surfaces of this resin base 21; and a via 23 acting as a second interlayer conductive layer, the via 23 being configured from a conductive paste and being formed by filling the conductive paste inside a via hole 3 that penetrates these first adhesive layer 22 and resin base 21. Each of the single-sided boards 30 respectively comprises: a film-shaped resin base 31 acting as a third insulating layer; a wiring 32 acting as a second wiring layer, the wiring 32 being formed on one surface of this resin base 31; a second adhesive layer 22a provided on the other surface of the resin base 31; and a via 33 acting as a third interlayer conductive layer, the via 33 being configured from the conductive paste and being formed by filling the conductive paste inside a via hole 4 that penetrates this second adhesive layer 22a and the resin base 31.

In this way, the double-sided board 10 and the single-sided board 30 can be respectively configured by a double-sided CCL and a single-sided CCL. Each of the resin bases 11, 21, and 31 is respectively configured by, for example, a resin film of a low permittivity material and having a thickness of about 25 μm. Employable as the resin film are, for example, a polyimide, a polyolefin, a liquid crystal polymer (LCP), and so on.

The wiring 12 and 32 are configured from, for example, copper foil pattern formed on the resin bases 11 and 31, and so on. Each of the electronic components 90 is configured from an active component of a semiconductor element such as a transistor, an integrated circuit (IC), a diode, and so on, or a passive component such as a resistor, a capacitor, a relay, a piezoelectric element, and so on. The electronic component 90 shown in FIG. 1 indicates, for example, a WLP (Wafer Level Package) that has been rewired. Provided on an electrode formation surface side of the electronic component 90 are a plurality of rewiring electrodes 91 each formed on a pad which is not illustrated, and formed in a periphery of the rewiring electrodes 91 is an insulating layer which is not illustrated.

The vias 23 and 33 are configured from the conductive paste respectively filled into the via holes 3 and 4. The conductive paste includes, for example, at least one kind of metallic particle of low electrical resistance selected from the likes of nickel, gold, silver, copper, aluminum, and iron, and at least one kind of metallic particle of low melting point selected from the likes of tin, bismuth, indium, and lead. Moreover, the conductive paste is configured from a paste having mixed into these metallic particles a binder component whose main component is an epoxy, an acrylic, a urethane, and so on.

The conductive paste configured in this way comprises characteristics of a sintered type metal having a curing temperature of about 150° C. to 200° C. and a post-curing melting point of about 260° C. or more, and comprises characteristics that, for example, the metal of low melting point contained therein can melt and form an alloy at a temperature of 200° C. or less, and specifically can form an intermetallic compound with the likes of copper or silver. Therefore, a connection between each of the vias 23 and 33 and the wiring 12 and 32 is alloyed by an intermetallic compound during thermal compression bonding of collective stacking.

Note that the conductive paste may also be configured by a nanopaste in which, for example, a filler of the likes of gold, silver, copper, or nickel with a nanolevel particle diameter is mixed into a binder component of the above-described kind. In addition, the conductive paste may also be configured by a paste having metallic particles of the above-described nickel, and so on, mixed into a binder component of the above-described kind.

In this case, the conductive paste is characterized in that electrical connection is performed by contact between fellow metallic particles. Note that employable as a method of filling the conductive paste into the via holes 3 and 4 is, for example, a printing method, a spin coating method, a spray coating method, a dispensing method, a laminating method, a method combining use of these methods, and so on. Note that the via 13 is configured by plating applied to the via hole 2 in order to make interlayer connection between the wiring 12 formed on both surfaces of the resin base 11 as mentioned above.

In the component built-in board 1 according to the first embodiment, five layers of the unit boards are stacked in order of the double-sided boards 10 being disposed sandwiching the intermediate board 20, followed by the single-sided boards 30 being further disposed sandwiching the intermediate board 20 sandwiched by the double-sided boards 10. The electronic components 90 housed in the openings 19 of the double-sided boards 10 are each built in disposed such that a back surface side which is on an opposite side to an electrode formation surface thereof faces the intermediate board 20.

In addition, each of the single-sided boards 30 is disposed in a state where a portion of the vias 33 are connected to the rewiring electrode 91 of the electronic component 90 and the wiring 32 is positioned on each of a front surface side and a back surface side of the component built-in board 1. The intermediate board 20 and each of the double-sided boards 10 are respectively adhered by the first adhesive layer 22 of the intermediate board 20, and each of the double-sided boards 10 and the single-sided boards 30 are respectively adhered by the second adhesive layer 22a of the single-sided board 30. The first and second adhesive layers 22 and 22a are configured from, for example, an organic system adhesive material including a volatile component, such as an epoxy system or acrylic system, and so on.

The component built-in board 1 configured in this way is configured from a five-layer structure combining and stacking therein the double-sided board 10, the intermediate board 20, and the single-sided board 30 acting as the unit boards, and houses each of the electronic components 90 in the opening 19 to build the electronic components 90 into the component built-in board 1 in the stacking direction. As a result, a thickness of a place where the electronic component 90 is built in can be adjusted to a thickness substantially equivalent to a thickness of the double-sided board 10, and a thickness of the board overall can be suppressed to achieve thinning.

In addition, after producing the double-sided board 10, the intermediate board 20, and the single-sided board 30 of simple structure and housing the electronic component 90 in the double-sided board 10, the component built-in board 1 can be manufactured by collective stacking by, for example, thermal compression bonding, hence a manufacturing process can be simplified. Furthermore, the electronic component 90 housed in the opening 19 is built in a state of having its periphery surrounded by the first and second adhesive layers 22 and 22a, and the resin base 21 of the intermediate board 20 intervenes between each of the electronic components 90, hence insulating reliability can be raised while securing mechanical strength in the stacking direction.

Next, a method of manufacturing the component built-in board 1 according to the first embodiment will be described.

FIGS. 2 to 5 are each a flowchart showing a manufacturing process due to the method of manufacturing the component built-in board 1 according to the first embodiment. In addition, FIGS. 6A, 6B, 6C, 6D, 6E, 7A, 7B, 8A, 8B, 8C, and 9 are each a cross-sectional view showing the component built-in board on a manufacturing process basis. First, the manufacturing process of the single-sided board 30 will be described with reference to FIG. 2.

Figure 6A:
FIG. 6A is a cross-sectional view showing same component built-in board on a manufacturing process basis.

As shown in FIG. 6A, a single-sided CCL in which a conductor layer configured from the likes of a solid-state copper foil is formed on one surface of the resin base 31 has an etching resist formed on the conductor layer by, for example, photolithography, and then etching is performed to pattern form the wiring 32 (S100). The wiring 32 may also be formed by a method where a conductor thin film is formed on the resin base 31 by the likes of vapor deposition or sputtering, and then, after formation of a plating resist by the likes of photolithography, electrolytic plating is performed, and after detachment of the resist, the previously formed conductor thin film is removed by etching (semi-additive method).

The single-sided CCL employed here is, for example, configured from a structure in which the resin base 31 having a thickness of about 25 μm is affixed to the conductor layer configured from copper foil having a thickness of about 12 μm. Employable as this single-sided CCL is, for example, a single-sided CCL produced by applying a varnish of polyimide to copper foil and hardening the varnish, by a publicly known casting method.

Otherwise employable as the single-sided CCL are the likes of a single-sided CCL in which a seed layer is formed on a polyimide film by sputtering and the conductor layer is formed by growing copper by plating, or a single-sided CCL produced by attaching a rolled or electrolytic copper foil and a polyimide film by an adhesive material.

Note that the resin base 31 is not necessarily required to be configured from a polyimide, and as described above, may be configured from a plastic film of a liquid crystal polymer, or the like. Moreover, an etchant whose main component is ferric chloride or cupric chloride may be employed in the above-described etching.

Figure 6B:
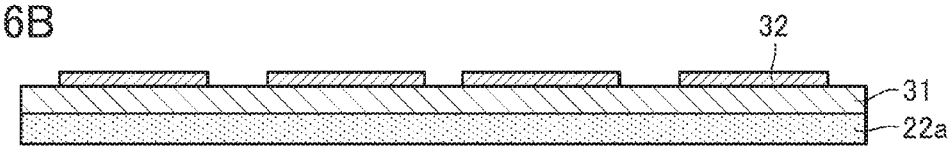
FIG. 6B is a cross-sectional view showing same component built-in board on a manufacturing process basis.

Next, as shown in FIG. 6B, an adhesive material is attached, by the likes of lamination, to another surface on an opposite side to a wiring 32 side of the resin base 31 (step S102), thereby forming the second adhesive layer 22a. Employable as the adhesive material attached in step S102 is, for example, an epoxy system thermosetting film having a thickness of about 25 μm. The attaching includes employing a vacuum laminator to, for example, heat-press and attach the adhesive material in a reduced pressure atmosphere, at a temperature where the adhesive material does not harden, by a pressure of 0.3 MPa.

Note that the adhesive material employed in the second adhesive layer 22a or the first adhesive layer 22 may be not only an epoxy system thermosetting resin, but also the likes of an acrylic system adhesive material or a thermoplastic adhesive material typified by a thermoplastic polyimide, or the like. Moreover, the adhesive material is not necessarily required to be in a film state, and may have resin coated in a varnish state.

Figure 6C:
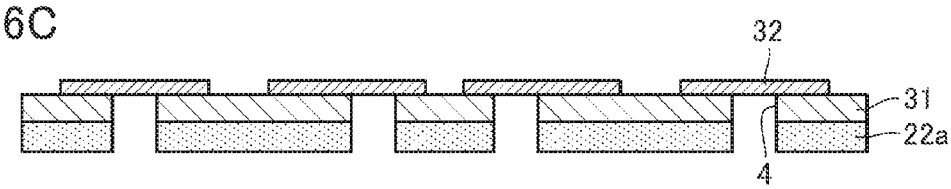
FIG. 6C is a cross-sectional view showing same component built-in board on a manufacturing process basis.

Then, as shown in FIG. 6C, a UV-YAG laser device, for example, is employed to irradiate laser light from a second adhesive layer 22a side toward the wiring 32, whereby the via hole 4 penetrating the second adhesive layer 22a and the resin base 31 is formed at a certain place (step S104). Note that after formation of the via hole 4, an inside of the via hole 4 undergoes, for example, plasma desmear processing.

The via hole 4 formed in step S104 may otherwise by formed by the likes of a carbon dioxide laser ($CO_2$ laser) or an excimer laser, or may be formed by the likes of drill processing or chemical etching. Moreover, the desmear processing can be performed by a mixed gas of $CF_4$ and $O_2$ (tetrafluoromethane+oxygen), but may also employ another inert gas such as Ar (argon), and may be configured as wet desmear processing employing a chemical, rather than so-called dry processing.

Figure 6D:
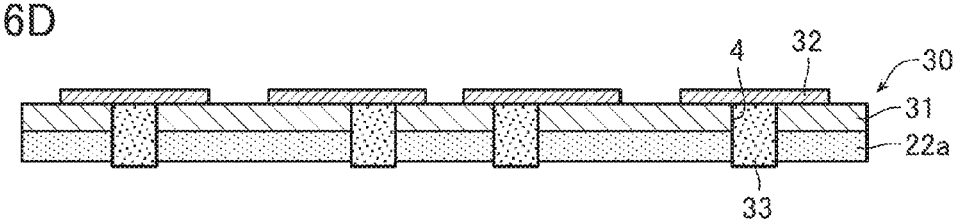
FIG. 6D is a cross-sectional view showing same component built-in board on a manufacturing process basis.

When the via hole 4 has been formed, then, as shown in FIG. 6D, the conductive paste of the above-mentioned kind is filled into the formed via hole 4 by, for example, screen printing, or the like (step S106), to form the via 33, and thereby manufacture a plurality of the single-sided boards 30 each including the resin base 31 provided with the second adhesive layer 22a.

Figure 6E:
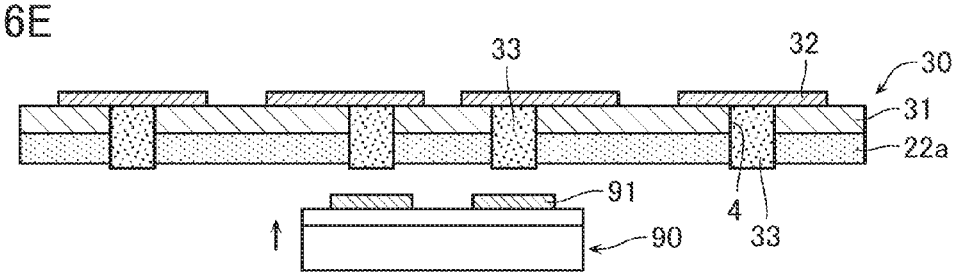
FIG. 6E is a cross-sectional view showing same component built-in board on a manufacturing process basis.

Then, as shown in FIG. 6E, the rewiring electrode 91 of the separately manufactured electronic component 90 is aligned with a certain via 33 of the single-sided board 30 using, for example, an electronic component mounting device (not illustrated), and heat is applied at a temperature not exceeding curing temperatures of the second adhesive layer 22a of the single-sided board 30 and the conductive paste of the via 33, whereby the electronic component 90 is provisionally adhered and mounted (step S108). In such a way, a plurality of the single-sided boards 30 having the electronic component mounted thereon, are prepared.

Figure 3:
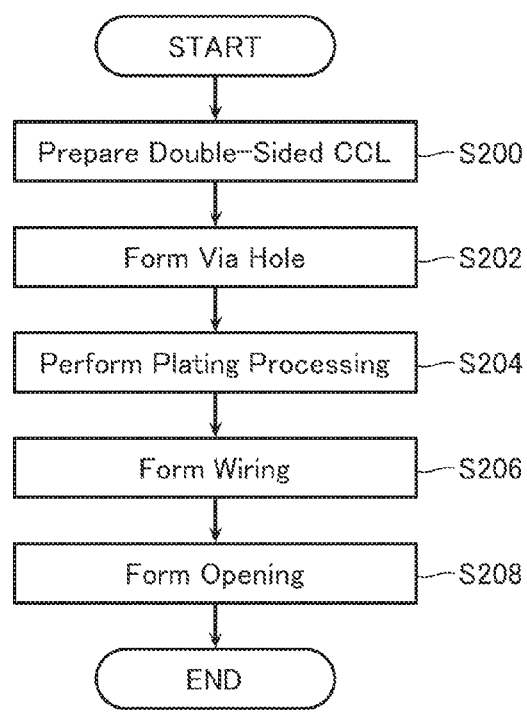
FIG. 3 is a flowchart showing a manufacturing process due to the method of manufacturing same component built-in board.

Next, the manufacturing process of the double-sided board 10 will be described with reference to FIG. 3.

First, a double-sided CCL in which a conductor layer is formed on both surfaces of the resin base 11 is prepared (step S200), the via hole 2 is formed at a certain place (step S202), and plasma desmear processing is performed.

Figure 7A:
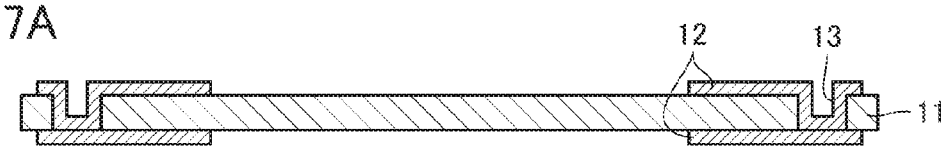
FIG. 7A is a cross-sectional view showing same component built-in board on a manufacturing process basis.

Next, panel plate processing is performed on all surfaces of the resin base 11 (step S204) to form a plating layer on the conductor layer and in the via hole 2, and thereby form a prototype of the wiring 12 and the via 13. Then, as shown in FIG. 7A, etching, and so on, is performed on both surfaces of the resin base 11 to pattern form the likes of the wiring 12 and the via 13 (step S206).

Figure 7B:
FIG. 7B is a cross-sectional view showing same component built-in board on a manufacturing process basis.

Finally, as shown in FIG. 7B, the resin base 11 at a portion thereof where the electronic component 90 is to be built in is removed by irradiating with laser light using a UV-YAG laser device, or the like, to form the opening 19 having a certain opening diameter (step S208), and thereby manufacture a plurality of the double-sided boards 10 each including the opening 19 where the electronic component 90 is to be housed.

Figure 4:
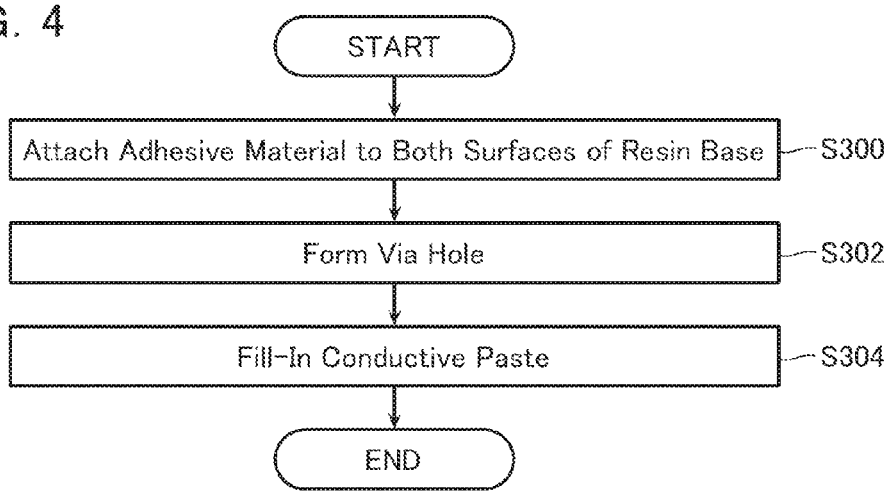
FIG. 4 is a flowchart showing a manufacturing process due to the method of manufacturing same component built-in board.
Figure 5:
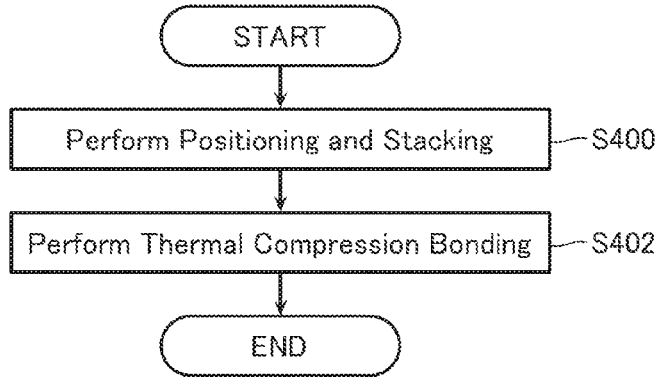
FIG. 5 is a flowchart showing a manufacturing process due to the method of manufacturing same component built-in board.

Next, the manufacturing process of the intermediate board 20 will be described with reference to FIG. 4.

Figure 8A:
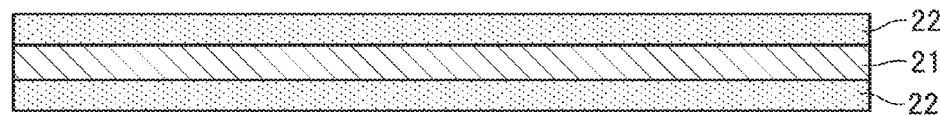
FIG. 8A is a cross-sectional view showing same component built-in board on a manufacturing process basis.

First, as shown in FIG. 8A, an adhesive material is attached, by the likes of lamination, to both surfaces of the resin base 21 configured from, for example, a polyimide film (step S300), thereby forming the first adhesive layer 22.

Figure 8B:
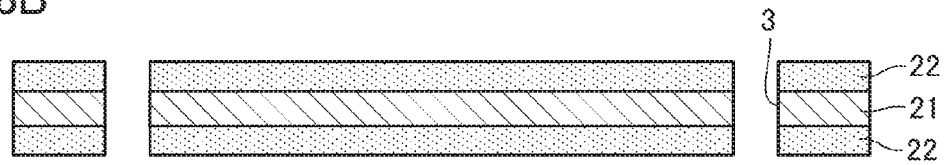
FIG. 8B is a cross-sectional view showing same component built-in board on a manufacturing process basis.
Figure 8C:
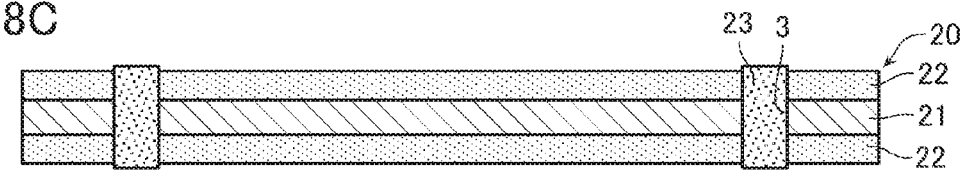
FIG. 8C is a cross-sectional view showing same component built-in board on a manufacturing process basis.

Next, as shown in FIG. 8B, a UV-YAG laser device, for example, is employed to irradiate laser light, whereby the via hole 3 penetrating each of the first adhesive layers 22 and the resin base 21 is formed at a certain place (step S302), and plasma desmear processing is performed. Finally, as shown in FIG. 8C, the above-described conductive paste is filled into the formed via hole 3 by, for example, screen printing, or the like (step S304), to form the via 23, and thereby manufacture the intermediate board 20 including the resin base 21 provided with the first adhesive layer 22 on both surfaces thereof.

Figure 9:
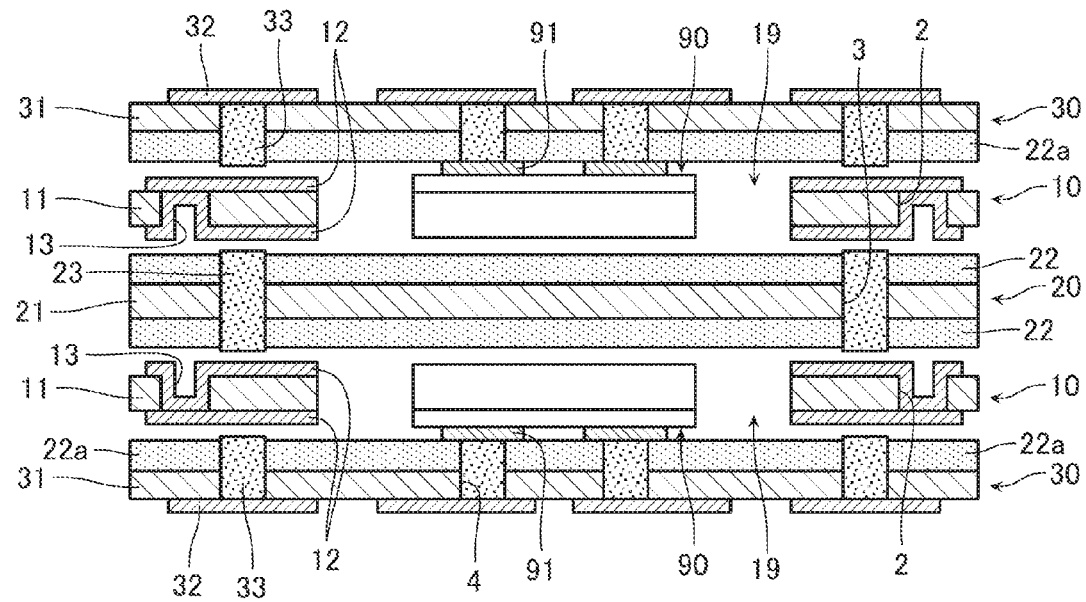
FIG. 9 is a cross-sectional view showing same component built-in board on a manufacturing process basis.

When the plurality of double-sided boards 10, the plurality of single-sided boards 30, and the intermediate board 20 have been produced in this way, then as shown in FIG. 9, the double-sided boards 10, the single-sided boards 30, and the intermediate board 20 are positioned and stacked in a state where each of the electronic components 90 mounted in each of the single-sided boards 30 and the opening 19 of each of the double-sided boards 10 are aligned, and each of the vias 23 and 33 and each of the wiring 12 are aligned, sandwiching the intermediate board 20 (step S400).

Finally, for example, in the case of performing thermal compression bonding, a vacuum press is employed to collectively stack by thermal compression bonding by applying heat and pressure in a reduced pressure atmosphere of 1 kPa or less (step S402), thereby manufacturing the component built-in board 1 having a five-layer structure of the kind shown in FIG. 1. During collective stacking, hardening and alloying of the conductive paste filled into the via holes 2, 3, and 4 is performed simultaneously to hardening of each of the first and second adhesive layers 22 and 22a between layers or in the opening 19 and each of the resin bases 11, 21, 31, and so on.

Therefore, an alloy layer of an intermetallic compound is formed between the vias 23 and 33 configured from the conductive paste and the wiring 12 and 32 contacting the vias 23 and 33, and between the via 33 and the rewiring electrode 91, and so on. As a result, mechanical strength of connections of each of the wiring 12 and 32 and vias 23 and 33 can be increased, and by reliably connecting these lines and vias, connection reliability can be increased. Note that stacking processing of each of the boards 10, 20, and 30 is not limited to collective stacking by thermal compression bonding.

Figure 10:
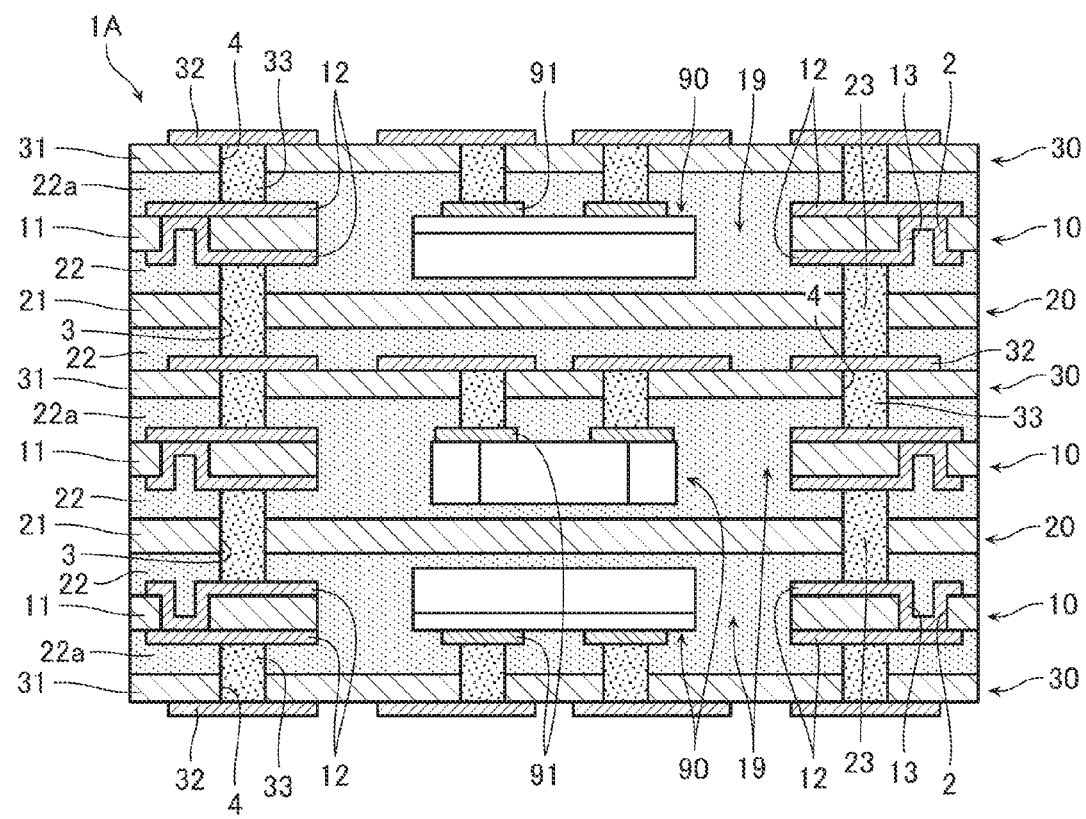
FIG. 10 is a cross-sectional view showing a component built-in board according to a second embodiment of the present invention.

FIG. 10 is a cross-sectional view showing a component built-in board according to a second embodiment of the present invention. A component built-in board 1A according to the second embodiment differs from the component built-in board 1 according to the first embodiment in comprising an eight-layer structure in which an intermediate board 20, a double-sided board 10, and a single-sided board 30 mounted with an electronic component 90 are further sequentially stacked on a front surface side of the component built-in board 1 according to the first embodiment, whereby the component built-in board 1A according to the second embodiment has three electronic components 90 built in thereto in the stacking direction.

If such a configuration is adopted, similar working effects to those of the component built-in board 1 according to the first embodiment can be displayed, and a thickness of the component built-in board 1A overall can be suppressed to achieve thinning, while building into the component built-in board 1A multiple, that is, not only three, but also four, five, or more, electronic components 90, in the stacking direction.

Figure 11:
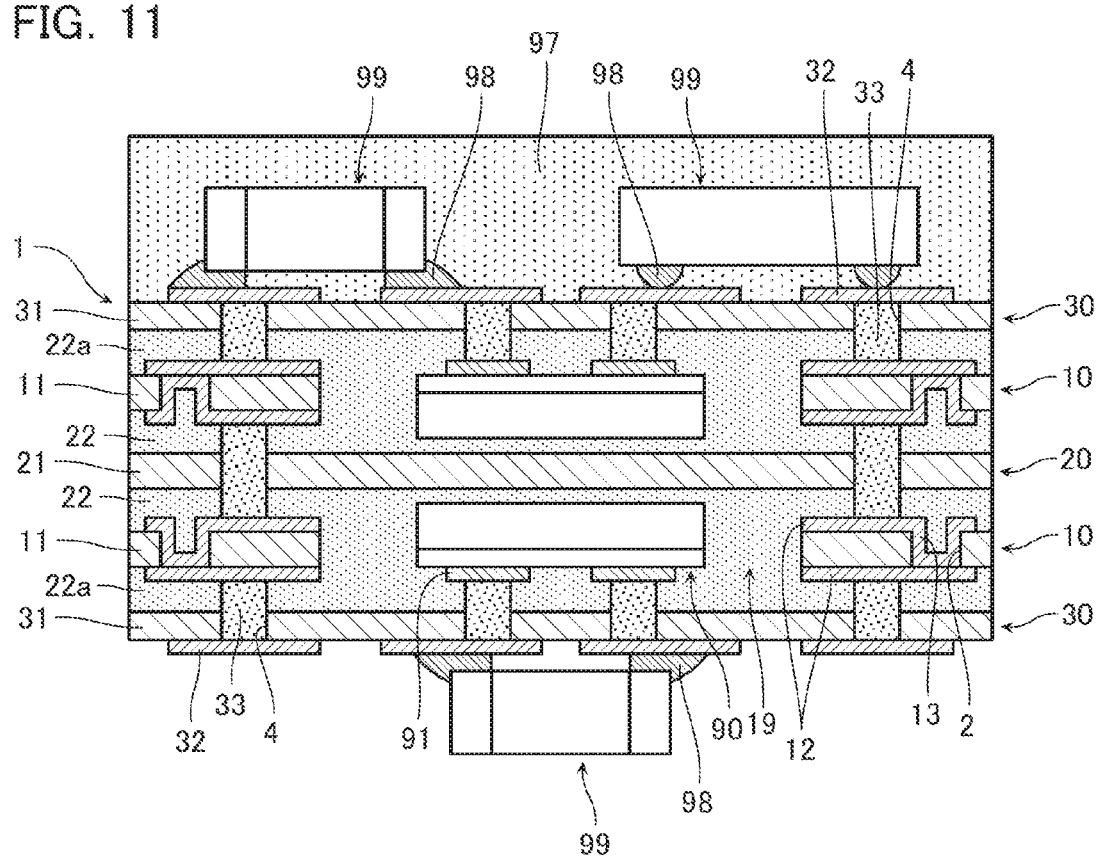
FIG. 11 is a cross-sectional view showing a mounting body comprising the component built-in board according to the first embodiment of the present invention.

FIG. 11 is a cross-sectional view showing a mounting body comprising the component built-in board according to the first embodiment of the present invention. A mounting body 100 has surface-mounted on a front surface side and a back surface side of the component built-in board 1 according to the first embodiment another electronic component 99 which is different from the electronic component 90 built into the component built-in board 1 according to the first embodiment. Each of the electronic components 99 is connected to the wiring 32 of the single-sided board 30 via a solder 98, by solder reflow processing at a temperature of about 260° C.

In the present example, the component built-in board 1 has one electronic component 99 surface-mounted on its back surface side and two electronic components 99 surface-mounted on its front surface side, but the two electronic components 99 on the front surface side are further sealed above the wiring 32 by a resin member 97 due to a mold resin, or the like. The mounting body 100 configured in this way can display similar working effects to those mentioned above, and since solder is not used in the component built-in board 1, can secure high connection reliability without solder remelting inside the board during solder reflow.

Figure 12:
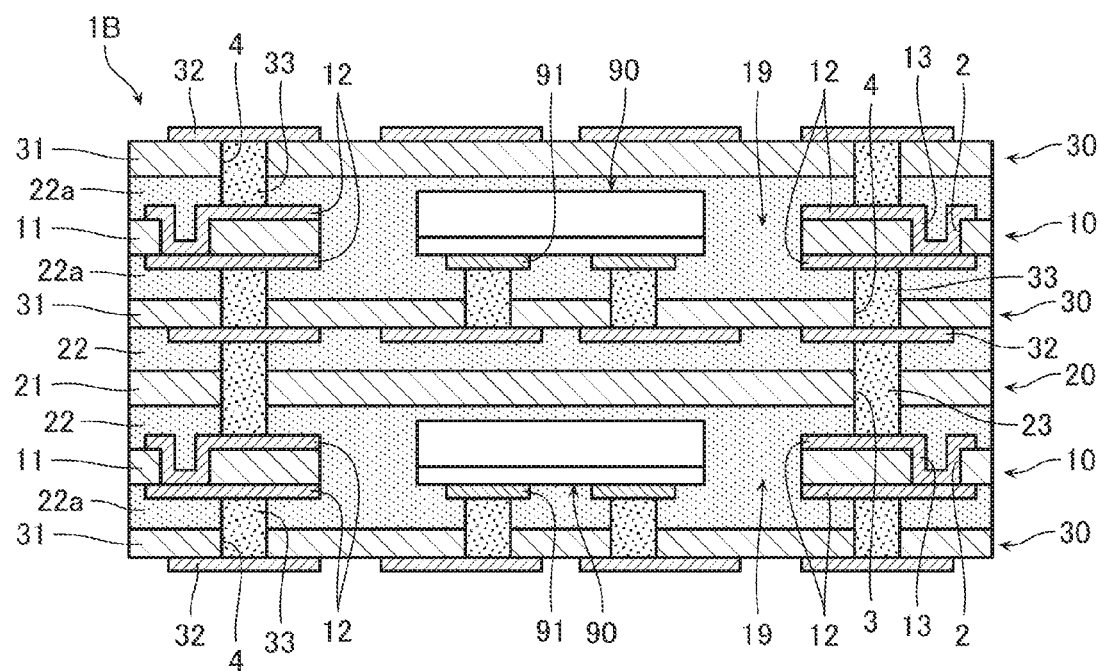
FIG. 12 is a cross-sectional view showing a component built-in board according to a third embodiment of the present invention.

FIG. 12 is a cross-sectional view showing a component built-in board according to a third embodiment of the present invention. A component built-in board 1B according to the third embodiment differs from the component built-in board 1 according to the first embodiment in reversing an orientation in the stacking direction of the double-sided board 10, the electronic component 90, and the single-sided board 30 on one side (an upper side) sandwiching the intermediate board 20 of the component built-in board 1 according to the first embodiment, and further stacking a single-sided board 30 on a front surface side of the component built-in board 1 according to the first embodiment.

Figure 13:
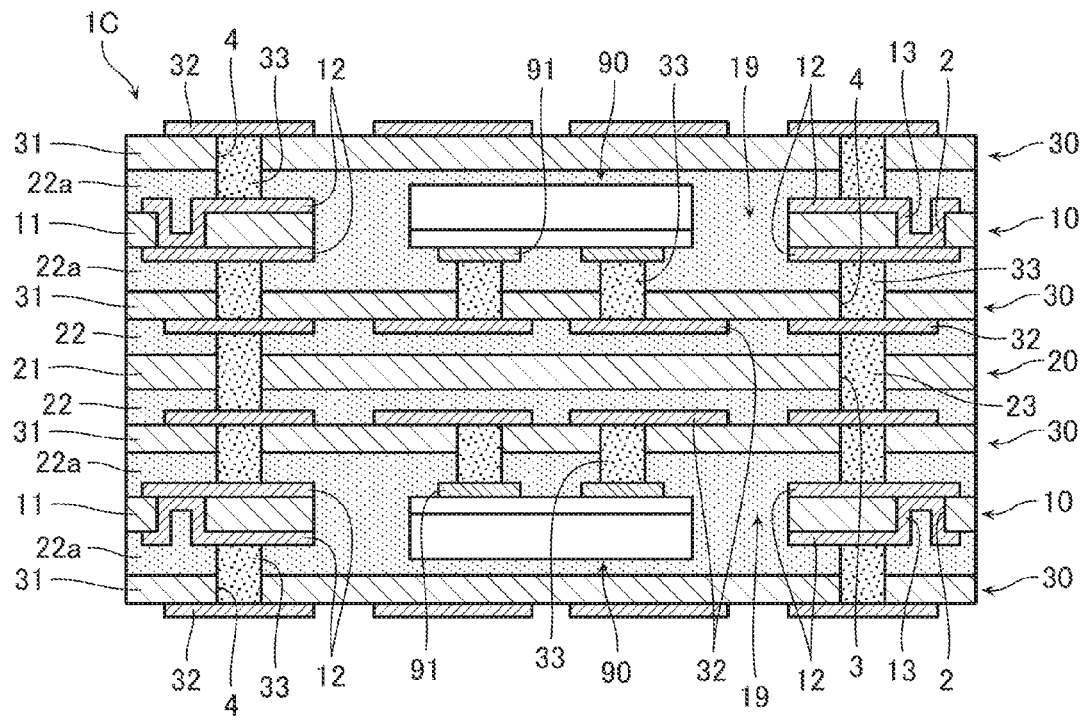
FIG. 13 is a cross-sectional view showing a component built-in board according to a fourth embodiment of the present invention.

FIG. 13 is a cross-sectional view showing a component built-in board according to a fourth embodiment of the present invention. A component built-in board 1C according to the fourth embodiment differs from the component built-in board 1B according to the third embodiment in reversing an orientation in the stacking direction of the double-sided board 10, the electronic component 90, and the single-sided board 30 on one side (a lower side) sandwiching the intermediate board 20 of the component built-in board 1B according to the third embodiment, and further stacking a single-sided board 30 on a back surface side of the component built-in board 1B according to the third embodiment.

Figure 14:
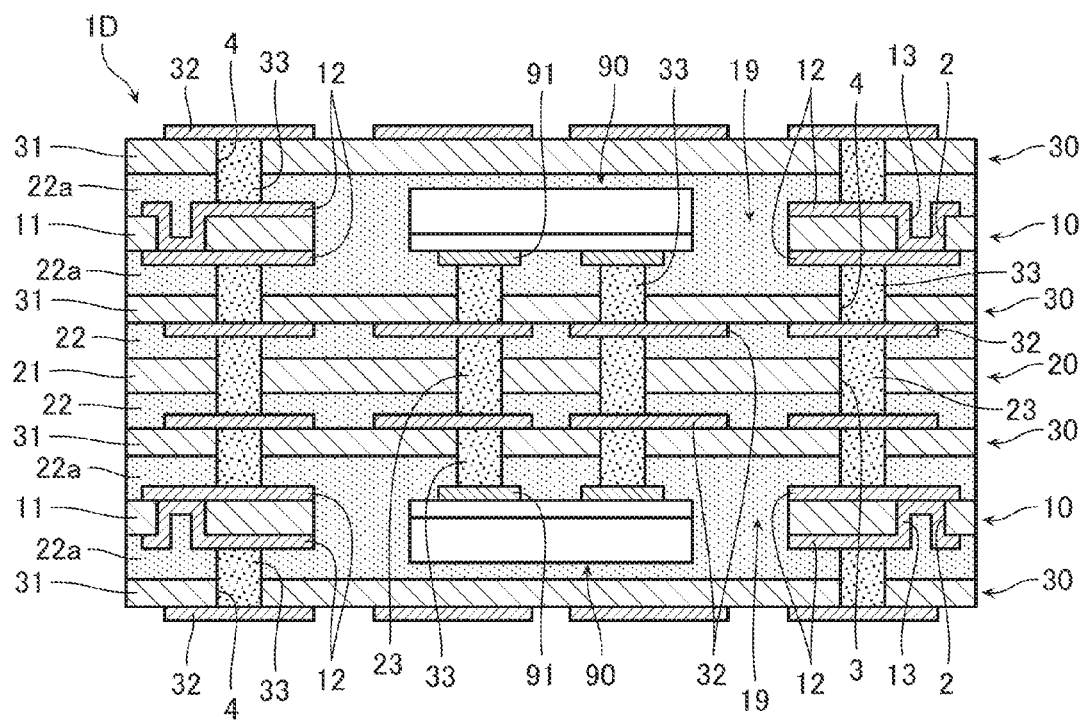
FIG. 14 is a cross-sectional view showing a component built-in board according to a fifth embodiment of the present invention.

FIG. 14 is a cross-sectional view showing a component built-in board according to a fifth embodiment of the present invention. A component built-in board 1D according to the fifth embodiment differs from the component built-in board 1C according to the fourth embodiment in being stacked further forming in the intermediate board 20 of the component built-in board 1C according to the fourth embodiment a via 23 that makes interlayer connection of fellow wiring 32 connected to the rewiring electrode 91 of each of the electronic components 90 via the via 33 of the single-sided board 30.

Configurations of the component built-in boards 1B to 1D according to these third through fifth embodiments also allow display of similar working effects to those of the first and second embodiments, namely the operational advantages that a thickness of the component built-in board overall can be suppressed to achieve thinning.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A component built-in board of multi-layer structure that has a plurality of unit boards stacked therein and is configured having a plurality of electronic components built in thereto in a stacking direction, wherein
the plurality of unit boards include:
an upper double-sided board and a lower double-sided board, each including:
a first insulating layer,
a first wiring layer formed on both surfaces of the first insulating layer,
a first interlayer conductive layer that penetrates the first insulating layer and is connected to the first wiring layer, and
an opening in which the electronic component is housed,
wherein the first wiring layer includes a front first wiring layer disposed on a front surface of the first insulating layer and a back first wiring layer disposed on a back surface of the first insulating layer, the back surface of the first insulating layer being positioned opposite to the front surface of the first insulating layer in the stacking direction, and wherein the first interlayer conductive layer connects the front first wiring layer to the back first wiring layer; and
an intermediate board that includes a second insulating layer, a first adhesive layer provided on both surfaces of the second insulating layer, and a second interlayer conductive layer that penetrates the second insulating layer along with the first adhesive layer, wherein the first adhesive layer includes a front first adhesive layer disposed on a front surface of the second insulating layer and a back first adhesive layer disposed on a back surface of the second insulating layer, the back surface of the second insulating layer being positioned opposite to the front surface of the second insulating layer in the stacking direction,
wherein the upper double-sided board is disposed above the intermediate board and the lower double-sided board is disposed below the intermediate board.

2. The component built-in board according to claim 1, wherein
the plurality of unit boards include:
a single-sided board that comprises a third insulating layer, a second wiring layer formed on one of surfaces of the third insulating layer, a third interlayer conductive layer that penetrates the third insulating layer and is connected to the second wiring layer, and a second adhesive layer provided on the other of the surfaces of the third insulating layer, and
the single-sided board and the intermediate board are stacked sandwiching one of the double-sided boards that has the electronic component housed therein in the opening, and a portion of the third interlayer conductive layer of the single-sided board is connected to the electronic component.

3. The component built-in board according to claim 1, wherein
the plurality of unit boards include:
a single-sided board that comprises a third insulating layer, a second wiring layer formed on one of surfaces of the third insulating layer, a third interlayer conductive layer that penetrates the third insulating layer and is connected to the second wiring layer, and a second adhesive layer provided on the other of the surfaces of the third insulating layer, and
the intermediate board and one of the double-sided boards that has the electronic component housed therein in the opening are stacked sandwiching the single-sided board, and a portion of the third interlayer conductive layer of the single-sided board is connected to the electronic component.

4. A mounting body that has another electronic component surface-mounted on at least one mounting surface of a front surface and a back surface of the component built-in board of claim 1.

5. The component built-in board according to claim 1, wherein the second insulating layer is a resin base.

6. A mounting body that has another electronic component surface-mounted on at least one mounting surface of a front surface and a back surface of the component built-in board of claim 2.

7. A mounting body that has another electronic component surface-mounted on at least one mounting surface of a front surface and a back surface of the component built-in board of claim 3.

8. The component built-in board according to claim 5, wherein the upper double-sided board is bonded to the intermediate board by the front first adhesive layer of the intermediate board.

9. The component built-in board according to claim 5, wherein the lower double-sided board is bonded to the intermediate board by the back first adhesive layer of the intermediate board.

10. The component built-in board according to claim 8, wherein the front first adhesive layer of the intermediate board is disposed between the electronic component housed in the upper double-sided board and the second insulating layer of the intermediate board.

11. The component built-in board according to claim 9, wherein the back first adhesive layer of the intermediate board is disposed between the electronic component housed in the lower double-sided board and the second insulating layer of the intermediate board.

12. A method of manufacturing a component built-in board, the component built-in board being a component built-in board of multi-layer structure that has a plurality of unit boards stacked therein and is configured having a plurality of electronic components built in thereto in a stacking direction, the method comprising the steps of:
producing a first unit board which is an upper double-sided board and a second unit board which is an lower double-sided board, the upper double-sided board and the lower double-sided board each including:
a first insulating layer,
a first wiring layer formed on both surfaces of the first insulating layer,
a first interlayer conductive layer that penetrates the first insulating layer and is connected to the first wiring layer, and
an opening in which the electronic component is to be housed,
wherein the first wiring layer includes a front first wiring layer disposed on a front surface of the first insulating layer and a back first wiring layer disposed on a back surface of the first insulating layer, the back surface of the first insulating layer being positioned opposite to the front surface of the first insulating layer in the stacking direction, and wherein the first interlayer conductive layer connects the front first wiring layer to the back first wiring layer;
providing a first adhesive layer on a front surface of a second insulating layer as a front first adhesive layer and on a back surface of the second insulating layer as a back first adhesive layer, the back surface being positioned opposite to the front surface in the stacking direction and forming a second interlayer conductive layer that penetrates the second insulating layer along with the first adhesive layers, to produce an intermediate board as the unit board; and housing the electronic component in the opening of the produced respective double-sided boards and stacking a plurality of the unit boards in the stacking direction, in the step of stacking, stacking such that the upper double-sided board is disposed above the produced intermediate board and the lower double-sided board is disposed below the intermediate board.

13. The method of manufacturing the component built-in board according to claim 12, further comprising the step of:

forming a second wiring layer on one of surfaces of a third insulating layer, forming a third interlayer conductive layer connected to the second wiring layer by penetrating the third insulating layer, and providing a second adhesive layer on the other of the surfaces of the third insulating layer, to produce a single-sided board as the unit board, wherein in the step of stacking, the single-sided board and the intermediate board are stacked so as to be in a state of sandwiching one of the double-sided boards that has the electronic component housed therein in the opening, such that a portion of the third interlayer conductive layer of the single-sided board is connected to the electronic component.

14. The method of manufacturing the component built-in board according to claim 12, further comprising the step of:

forming a second wiring layer on one of surfaces of a third insulating layer, forming a third interlayer conductive layer connected to the second wiring layer by penetrating the third insulating layer, and providing a second adhesive layer on the other of the surfaces of the third insulating layer, to produce a single-sided board as the unit board, wherein in the step of stacking, the intermediate board and one of the double-sided boards that has the electronic component housed therein in the opening are stacked so as to be in a state of sandwiching the single-sided board, such that a portion of the third interlayer conductive layer of the single-sided board is connected to the electronic component.

15. The method of manufacturing the component built-in board according to claim 12, wherein the second insulating layer is a resin base.

16. The method of manufacturing the component built-in board according to claim 15, wherein the upper double-sided board is bonded to the intermediate board by the front first adhesive layer of the intermediate board.

17. The method of manufacturing the component built-in board according to claim 15, wherein the lower double-sided board is bonded to the intermediate board by the back first adhesive layer of the intermediate board.

18. The method of manufacturing the component built-in board according to claim 16, wherein the front first adhesive layer of the intermediate board is disposed between the electronic component housed in the upper double-sided board and the second insulating layer of the intermediate board.

19. The method of manufacturing the component built-in board according to claim 17, wherein the back first adhesive layer of the intermediate board is disposed between the electronic component housed in the lower double-sided board and the second insulating layer of the intermediate board.

* * * * *